US008929402B1

(12) United States Patent
Hughes

(10) Patent No.: US 8,929,402 B1
(45) Date of Patent: Jan. 6, 2015

(54) SYSTEMS AND METHODS FOR COMPRESSING PACKET DATA BY PREDICTING SUBSEQUENT DATA

(71) Applicant: David Anthony Hughes, Los Altos Hills, CA (US)

(72) Inventor: David Anthony Hughes, Los Altos Hills, CA (US)

(73) Assignee: Silver Peak Systems, Inc., Santa Clara, CA (US)

( * ) Notice: Subject to any disclaimer, the term of this patent is extended or adjusted under 35 U.S.C. 154(b) by 197 days.

(21) Appl. No.: 13/657,733

(22) Filed: Oct. 22, 2012

Related U.S. Application Data

(63) Continuation-in-part of application No. 12/313,618, filed on Nov. 20, 2008, now Pat. No. 8,811,431.

(51) Int. Cl.
*H04J 3/18* (2006.01)
*H04L 29/06* (2006.01)

(52) U.S. Cl.
CPC ................................. *H04L 69/04* (2013.01)
USPC ........................................................ 370/477

(58) Field of Classification Search
CPC ....................................................... H04L 69/04
USPC ..................................... 370/464, 477; 341/51
See application file for complete search history.

(56) References Cited

U.S. PATENT DOCUMENTS

| | | | |
|---|---|---|---|
| 4,494,108 A * | 1/1985 | Langdon et al. | 341/51 |
| 4,612,532 A * | 9/1986 | Bacon et al. | 341/51 |
| 5,023,611 A * | 6/1991 | Chamzas et al. | 341/51 |
| 5,243,341 A | 9/1993 | Seroussi et al. | |
| 5,307,413 A | 4/1994 | Denzer | |
| 5,357,250 A * | 10/1994 | Healey et al. | 341/107 |
| 5,359,720 A | 10/1994 | Tamura et al. | |
| 5,483,556 A | 1/1996 | Pillan et al. | |
| 5,592,613 A | 1/1997 | Miyazawa et al. | |
| 5,611,049 A | 3/1997 | Pitts | |
| 5,627,533 A * | 5/1997 | Clark | 341/51 |
| 5,635,932 A * | 6/1997 | Shinagawa et al. | 341/51 |
| 5,652,581 A * | 7/1997 | Furlan et al. | 341/51 |
| 5,659,737 A * | 8/1997 | Matsuda | 707/693 |
| 5,675,587 A | 10/1997 | Okuyama et al. | |
| 5,710,562 A * | 1/1998 | Gormish et al. | 341/107 |
| 5,748,122 A * | 5/1998 | Shinagawa et al. | 341/67 |
| 5,754,774 A | 5/1998 | Bittinger et al. | |
| 5,802,106 A | 9/1998 | Packer | |
| 5,883,891 A | 3/1999 | Williams et al. | |
| 5,955,976 A * | 9/1999 | Heath | 341/87 |

(Continued)

FOREIGN PATENT DOCUMENTS

EP      1507353 A2      2/2005

OTHER PUBLICATIONS

Knutsson, Bjorn et al., "Transparent Proxy Signalling", Journal of Communications and Networks, vol. 3, No. 2, Jun. 2001.

(Continued)

*Primary Examiner* — Chi H Pham
*Assistant Examiner* — Robert Lopata
(74) *Attorney, Agent, or Firm* — Carr & Ferrell LLP

(57) ABSTRACT

A system, method, and computer program for compressing packet data is provided. In exemplary embodiments, one or more prefix arrays may be generated for retrieved data, and used as the basis for predicting subsequent data. The packet data may be compressed based, at least partially, on the predicted subsequent data. Accordingly, the compressed packet data may be transferred over a communication network.

10 Claims, 10 Drawing Sheets

(56) References Cited

U.S. PATENT DOCUMENTS

| | | |
|---|---|---|
| 6,000,053 A | 12/1999 | Levine et al. |
| 6,003,087 A | 12/1999 | Housel, III et al. |
| 6,054,943 A * | 4/2000 | Lawrence ................. 341/87 |
| 6,081,883 A | 6/2000 | Popelka et al. |
| 6,295,541 B1 | 9/2001 | Bodnar et al. |
| 6,308,148 B1 | 10/2001 | Bruins et al. |
| 6,311,260 B1 | 10/2001 | Stone et al. |
| 6,374,266 B1 | 4/2002 | Shnelvar |
| 6,434,662 B1 | 8/2002 | Greene et al. |
| 6,438,664 B1 | 8/2002 | McGrath et al. |
| 6,452,915 B1 | 9/2002 | Jorgensen |
| 6,489,902 B2 * | 12/2002 | Heath ..................... 341/87 |
| 6,587,985 B1 | 7/2003 | Fukushima et al. |
| 6,618,397 B1 | 9/2003 | Huang |
| 6,633,953 B2 | 10/2003 | Stark |
| 6,643,259 B1 | 11/2003 | Borella et al. |
| 6,650,644 B1 | 11/2003 | Colley et al. |
| 6,667,700 B1 | 12/2003 | McCanne et al. |
| 6,674,769 B1 | 1/2004 | Viswanath |
| 6,718,361 B1 | 4/2004 | Basani et al. |
| 6,738,379 B1 | 5/2004 | Balazinski et al. |
| 6,769,048 B2 | 7/2004 | Goldberg et al. |
| 6,791,945 B1 | 9/2004 | Levenson et al. |
| 6,856,651 B2 | 2/2005 | Singh |
| 6,859,842 B1 | 2/2005 | Nakamichi et al. |
| 6,910,106 B2 | 6/2005 | Sechrest et al. |
| 6,968,374 B2 | 11/2005 | Lemieux et al. |
| 6,978,384 B1 | 12/2005 | Milliken |
| 7,007,044 B1 | 2/2006 | Rafert et al. |
| 7,020,750 B2 | 3/2006 | Thiyagaranjan et al. |
| 7,035,214 B1 | 4/2006 | Seddigh et al. |
| 7,069,342 B1 | 6/2006 | Biederman |
| 7,113,962 B1 | 9/2006 | Kee et al. |
| 7,120,666 B2 | 10/2006 | McCanne et al. |
| 7,145,889 B1 | 12/2006 | Zhang et al. |
| 7,197,597 B1 | 3/2007 | Scheid et al. |
| 7,200,847 B2 | 4/2007 | Straube et al. |
| 7,215,667 B1 | 5/2007 | Davis |
| 7,242,681 B1 | 7/2007 | Van Bokkelen et al. |
| 7,243,094 B2 | 7/2007 | Tabellion et al. |
| 7,266,645 B2 | 9/2007 | Garg et al. |
| 7,318,100 B2 | 1/2008 | Demmer et al. |
| 7,366,829 B1 | 4/2008 | Luttrell et al. |
| 7,380,006 B2 | 5/2008 | Srinivas et al. |
| 7,383,329 B2 | 6/2008 | Erickson |
| 7,383,348 B2 | 6/2008 | Seki et al. |
| 7,388,844 B1 | 6/2008 | Brown et al. |
| 7,389,357 B2 | 6/2008 | Duffie, III et al. |
| 7,389,393 B1 | 6/2008 | Karr et al. |
| 7,417,991 B1 | 8/2008 | Crawford et al. |
| 7,420,992 B1 | 9/2008 | Fang et al. |
| 7,428,573 B2 | 9/2008 | McCanne et al. |
| 7,451,237 B2 | 11/2008 | Takekawa et al. |
| 7,453,379 B2 | 11/2008 | Plamondon |
| 7,457,315 B1 | 11/2008 | Smith |
| 7,471,629 B2 | 12/2008 | Melpignano |
| 7,532,134 B2 | 5/2009 | Samuels et al. |
| 7,555,484 B2 | 6/2009 | Kulkarni et al. |
| 7,571,343 B1 | 8/2009 | Xiang et al. |
| 7,571,344 B2 | 8/2009 | Hughes et al. |
| 7,619,545 B2 | 11/2009 | Samuels et al. |
| 7,620,870 B2 | 11/2009 | Srinivasan et al. |
| 7,624,446 B1 | 11/2009 | Wilhelm |
| 7,630,295 B2 | 12/2009 | Hughes et al. |
| 7,639,700 B1 | 12/2009 | Nabhan et al. |
| 7,643,426 B1 | 1/2010 | Lee et al. |
| 7,644,230 B1 | 1/2010 | Hughes et al. |
| 7,676,554 B1 | 3/2010 | Malmskog et al. |
| 7,698,431 B1 | 4/2010 | Hughes |
| 7,714,747 B2 | 5/2010 | Fallon |
| 7,746,781 B1 | 6/2010 | Xiang |
| 7,764,606 B1 | 7/2010 | Ferguson et al. |
| 7,849,134 B2 | 12/2010 | McCanne et al. |
| 7,853,699 B2 | 12/2010 | Wu et al. |
| 7,873,786 B1 | 1/2011 | Singh et al. |
| 7,941,606 B1 | 5/2011 | Pullela et al. |
| 7,945,736 B2 | 5/2011 | Hughes et al. |
| 7,948,921 B1 | 5/2011 | Hughes et al. |
| 7,953,869 B2 | 5/2011 | Demmer et al. |
| 7,970,898 B2 | 6/2011 | Clubb et al. |
| 8,069,225 B2 | 11/2011 | McCanne et al. |
| 8,095,774 B1 | 1/2012 | Hughes et al. |
| 8,140,757 B1 | 3/2012 | Singh et al. |
| 8,171,238 B1 | 5/2012 | Hughes et al. |
| 8,225,072 B2 | 7/2012 | Hughes et al. |
| 8,307,115 B1 | 11/2012 | Hughes |
| 8,312,226 B2 | 11/2012 | Hughes |
| 8,370,583 B2 | 2/2013 | Hughes |
| 8,392,684 B2 | 3/2013 | Hughes |
| 8,442,052 B1 | 5/2013 | Hughes |
| 8,473,714 B2 | 6/2013 | Hughes et al. |
| 8,489,562 B1 | 7/2013 | Hughes et al. |
| 8,595,314 B1 | 11/2013 | Hughes |
| 8,706,947 B1 | 4/2014 | Vincent |
| 8,755,381 B2 | 6/2014 | Hughes et al. |
| 8,811,431 B2 | 8/2014 | Hughes |
| 2001/0054084 A1 | 12/2001 | Kosmynin |
| 2002/0007413 A1 | 1/2002 | Garcia-Luna-Aceves et al. |
| 2002/0040475 A1 | 4/2002 | Yap et al. |
| 2002/0061027 A1 | 5/2002 | Abiru et al. |
| 2002/0065998 A1 | 5/2002 | Buckland |
| 2002/0078242 A1 | 6/2002 | Viswanath |
| 2002/0101822 A1 | 8/2002 | Ayyagari et al. |
| 2002/0107988 A1 | 8/2002 | Jordan |
| 2002/0116424 A1 | 8/2002 | Radermacher et al. |
| 2002/0131434 A1 | 9/2002 | Vukovic et al. |
| 2002/0150041 A1 | 10/2002 | Reinshmidt et al. |
| 2002/0163911 A1 | 11/2002 | Wee et al. |
| 2002/0169818 A1 | 11/2002 | Stewart et al. |
| 2002/0181494 A1 | 12/2002 | Rhee |
| 2002/0188871 A1 | 12/2002 | Noehring et al. |
| 2002/0194324 A1 | 12/2002 | Guha |
| 2003/0002664 A1 | 1/2003 | Anand |
| 2003/0009558 A1 | 1/2003 | Ben-Yehezkel |
| 2003/0012400 A1 * | 1/2003 | McAuliffe et al. ........... 382/100 |
| 2003/0123481 A1 | 7/2003 | Neale et al. |
| 2003/0133568 A1 | 7/2003 | Stein et al. |
| 2003/0142658 A1 | 7/2003 | Ofuji et al. |
| 2003/0149661 A1 | 8/2003 | Mitchell et al. |
| 2003/0149869 A1 | 8/2003 | Gleichauf |
| 2003/0233431 A1 | 12/2003 | Reddy et al. |
| 2004/0008711 A1 | 1/2004 | Lahti et al. |
| 2004/0047308 A1 | 3/2004 | Kavanagh et al. |
| 2004/0083299 A1 | 4/2004 | Dietz et al. |
| 2004/0086114 A1 | 5/2004 | Rarick |
| 2004/0088376 A1 | 5/2004 | McCanne et al. |
| 2004/0114569 A1 | 6/2004 | Naden et al. |
| 2004/0117571 A1 | 6/2004 | Chang et al. |
| 2004/0123139 A1 | 6/2004 | Aiello et al. |
| 2004/0179542 A1 | 9/2004 | Murakami et al. |
| 2004/0199771 A1 | 10/2004 | Morten et al. |
| 2004/0202110 A1 | 10/2004 | Kim |
| 2004/0203820 A1 | 10/2004 | Billhartz |
| 2004/0205332 A1 | 10/2004 | Bouchard et al. |
| 2004/0243571 A1 | 12/2004 | Judd |
| 2004/0255048 A1 | 12/2004 | Lev Ran et al. |
| 2005/0010653 A1 | 1/2005 | McCanne |
| 2005/0044270 A1 | 2/2005 | Grove et al. |
| 2005/0053094 A1 | 3/2005 | Cain et al. |
| 2005/0091234 A1 | 4/2005 | Hsu et al. |
| 2005/0111460 A1 | 5/2005 | Sahita |
| 2005/0131939 A1 | 6/2005 | Douglis et al. |
| 2005/0132252 A1 | 6/2005 | Fifer et al. |
| 2005/0141425 A1 | 6/2005 | Foulds |
| 2005/0171937 A1 | 8/2005 | Hughes et al. |
| 2005/0177603 A1 | 8/2005 | Shavit |
| 2005/0190694 A1 | 9/2005 | Ben-Nun et al. |
| 2005/0207443 A1 | 9/2005 | Kawamura et al. |
| 2005/0210151 A1 | 9/2005 | Abdo et al. |
| 2005/0220019 A1 | 10/2005 | Melpignano |
| 2005/0235119 A1 | 10/2005 | Sechrest et al. |
| 2005/0243743 A1 | 11/2005 | Kimura |
| 2005/0243835 A1 | 11/2005 | Sharma et al. |
| 2005/0256972 A1 | 11/2005 | Cochran et al. |

(56) References Cited

U.S. PATENT DOCUMENTS

| | | |
|---|---|---|
| 2005/0278459 A1 | 12/2005 | Boucher et al. |
| 2005/0286526 A1 | 12/2005 | Sood et al. |
| 2006/0013210 A1 | 1/2006 | Bordogna et al. |
| 2006/0026425 A1 | 2/2006 | Douceur et al. |
| 2006/0031936 A1 | 2/2006 | Nelson et al. |
| 2006/0036901 A1 | 2/2006 | Yang et al. |
| 2006/0039354 A1 | 2/2006 | Rao et al. |
| 2006/0059171 A1 | 3/2006 | Borthakur et al. |
| 2006/0059173 A1 | 3/2006 | Hirsch et al. |
| 2006/0117385 A1 | 6/2006 | Mester et al. |
| 2006/0143497 A1 | 6/2006 | Zohar et al. |
| 2006/0195547 A1 | 8/2006 | Sundarrajan et al. |
| 2006/0195840 A1 | 8/2006 | Sundarrajan et al. |
| 2006/0212426 A1 | 9/2006 | Shakara et al. |
| 2006/0218390 A1 | 9/2006 | Loughran et al. |
| 2006/0227717 A1 | 10/2006 | van den Berg et al. |
| 2006/0250965 A1 | 11/2006 | Irwin |
| 2006/0268932 A1 | 11/2006 | Singh et al. |
| 2006/0280205 A1 | 12/2006 | Cho |
| 2007/0002804 A1 | 1/2007 | Xiong et al. |
| 2007/0011424 A1 | 1/2007 | Sharma et al. |
| 2007/0038815 A1 | 2/2007 | Hughes |
| 2007/0038816 A1 | 2/2007 | Hughes et al. |
| 2007/0038858 A1 | 2/2007 | Hughes |
| 2007/0050475 A1 | 3/2007 | Hughes |
| 2007/0076693 A1 | 4/2007 | Krishnaswamy |
| 2007/0097874 A1 | 5/2007 | Hughes et al. |
| 2007/0110046 A1 | 5/2007 | Farrell et al. |
| 2007/0115812 A1 | 5/2007 | Hughes |
| 2007/0127372 A1 | 6/2007 | Khan et al. |
| 2007/0130114 A1 | 6/2007 | Li et al. |
| 2007/0140129 A1 | 6/2007 | Bauer et al. |
| 2007/0174428 A1 | 7/2007 | Lev Ran et al. |
| 2007/0195702 A1 | 8/2007 | Yuen et al. |
| 2007/0198523 A1 | 8/2007 | Hayim |
| 2007/0226320 A1 | 9/2007 | Hager et al. |
| 2007/0244987 A1 | 10/2007 | Pedersen et al. |
| 2007/0245079 A1 | 10/2007 | Bhattacharjee et al. |
| 2007/0248084 A1 | 10/2007 | Whitehead |
| 2007/0258468 A1 | 11/2007 | Bennett |
| 2007/0263554 A1 | 11/2007 | Finn |
| 2007/0276983 A1 | 11/2007 | Zohar et al. |
| 2007/0280245 A1 | 12/2007 | Rosberg |
| 2008/0005156 A1 | 1/2008 | Edwards et al. |
| 2008/0013532 A1 | 1/2008 | Garner et al. |
| 2008/0016301 A1 | 1/2008 | Chen |
| 2008/0028467 A1 | 1/2008 | Kommareddy et al. |
| 2008/0031149 A1 | 2/2008 | Hughes et al. |
| 2008/0031240 A1 | 2/2008 | Hughes et al. |
| 2008/0095060 A1 | 4/2008 | Yao |
| 2008/0133536 A1 | 6/2008 | Bjorner et al. |
| 2008/0184081 A1 | 7/2008 | Hama et al. |
| 2008/0205445 A1 | 8/2008 | Kumar et al. |
| 2008/0229137 A1 | 9/2008 | Samuels et al. |
| 2008/0243992 A1 | 10/2008 | Jardetzky et al. |
| 2008/0313318 A1 | 12/2008 | Vermeulen et al. |
| 2008/0320151 A1 | 12/2008 | McCanne et al. |
| 2009/0060198 A1 | 3/2009 | Little |
| 2009/0063696 A1 | 3/2009 | Wang et al. |
| 2009/0100483 A1 | 4/2009 | McDowell |
| 2009/0158417 A1 | 6/2009 | Khanna et al. |
| 2009/0175172 A1 | 7/2009 | Prytz et al. |
| 2009/0234966 A1 | 9/2009 | Samuels et al. |
| 2009/0265707 A1 | 10/2009 | Goodman et al. |
| 2009/0274294 A1* | 11/2009 | Itani .......................... 380/28 |
| 2009/0279550 A1 | 11/2009 | Romrell et al. |
| 2010/0005222 A1 | 1/2010 | Brant et al. |
| 2010/0011125 A1 | 1/2010 | Yang et al. |
| 2010/0020693 A1 | 1/2010 | Thakur |
| 2010/0054142 A1 | 3/2010 | Moiso et al. |
| 2010/0070605 A1 | 3/2010 | Hughes et al. |
| 2010/0115137 A1 | 5/2010 | Kim et al. |
| 2010/0121957 A1 | 5/2010 | Roy et al. |
| 2010/0124239 A1 | 5/2010 | Hughes |
| 2010/0131957 A1 | 5/2010 | Kami |
| 2010/0290364 A1 | 11/2010 | Black |
| 2010/0318892 A1 | 12/2010 | Teevan et al. |
| 2011/0154329 A1 | 6/2011 | Arcese et al. |
| 2011/0219181 A1 | 9/2011 | Hughes et al. |
| 2012/0036325 A1 | 2/2012 | Mashtizadeh et al. |
| 2012/0221611 A1 | 8/2012 | Watanabe et al. |
| 2012/0239872 A1 | 9/2012 | Hughes et al. |
| 2013/0080619 A1 | 3/2013 | Assuncao et al. |
| 2013/0086236 A1 | 4/2013 | Baucke et al. |
| 2013/0094501 A1 | 4/2013 | Hughes |
| 2013/0117494 A1 | 5/2013 | Hughes et al. |
| 2013/0282970 A1 | 10/2013 | Hughes et al. |
| 2014/0181381 A1 | 6/2014 | Hughes et al. |

OTHER PUBLICATIONS

"IPsec Anti-Replay Window: Expanding and Disabling," Cisco IOS Security Configuration Guide. 2005-2006 Cisco Systems, Inc. Last updated: Sep. 12, 2006, 14pages (Previously cited as: Zhao et al.; "Analysis and Improvement on IPSEC Anti-Replay Window Protocol"; 2003; IEEE' pp. 553-558).

Singh et al. ; "Future of Internet Security—IPSEC"; 2005; pp. 1-8.

Muthitacharoen, Athicha et al., "A Low-bandwidth Network File System," 2001, in Proc. of the 18th ACM Symposium on Operating Systems Principles, Banff, Canada, pp. 174-187.

"Shared LAN Cache Datasheet", 1996, http://www.lancache.com/slcdata.htm.

Spring et al., "A protocol-independent technique for eliminating redundant network traffic", ACM SIGCOMM Computer Communication Review, vol. 30, Issue 4 (Oct. 2000) pp. 87-95, Year of Publication: 2000.

Hong, B et al. "Duplicate data elimination in a San file system", In Proceedings of the 21st Symposium on Mass Storage Systems (MSS '04), Goddard, MD, Apr. 2004. IEEE.

You, L. L. and Karamanolis, C. 2004. "Evaluation of efficient archival storage techniques", In Proceedings of the 21st IEEE Symposium on Mass Storage Systems and Technologies (MSST).

Douglis, F. et al., "Application specific Delta-encoding via Resemblance Detection", Published in the 2003 USENIX Annual Technical Conference.

You, L. L. et al., "Deep Store an Archival Storage System Architecture" Data Engineering, 2005. ICDE 2005. Proceedings of the 21st. Intl. Conf. on Data Eng., Tokyo, Japan, Apr. 5-8, 2005, pp. 12.

Manber, Udi, "Finding Similar Files in a Large File System", TR 93-33 Oct. 1994, Department of Computer Science, University of Arizona. http://webglimpse.net/pubs/TR93-33.pdf. Also appears in the 1994 winter USENIX Technical Conference.

Definition memory (n), Webster's Third New International Dictionary, Unabridged (1993), available at <http://lionreference.chadwyck.com> (Dictionaries/Webster's Dictionary).

Definition appliance, 2c, Webster's Third New International Dictionary, Unabridged (1993), available at <http://lionreference.chadwyck.com> (Dictionaries/Webster's Dictionary).

Newton, "Newton's Telecom Dictionary", 17th Ed., 2001, pp. 38, 201, and 714.

* cited by examiner

500

502   506  508
      504 st secretary at Vienna? The ba:r:   5: 7782
    rovna to secure it..for the ba:r:   3: 7973
    hand, presenting to her his ba:l:   2: 3254
    d the fete at the English amba:s:   1: 3766
    st one.... Whom, I ask you, ca:n:   3: 5920
    me,"..he added with studied ca:r:   4: 7549
ish have not understood and ca:n:   7: 6235
    mercial spirit will not and ca:n:   3: 5988
ffering morally? Can one be ca:l:   4: 3615
intzingerode you would have ca:p:   3: 6954
ropos," she added, becoming ca:l:   3: 7108
ought today's fete had been ca:n:   3: 3938
ow that since your daughter ca:m:   3: 8959
    know everything."...."What ca:n:   3: 4331
    the file may be used.  You ca:n:   5:  706
    my 'faithful slave,"as you ca:l:   2: 1808
ll, Prince, so Genoa and Lucca: :   2: 1464
    did not feel like it, she beca:m:   2: 4828
most closed her eyes to indica:t:   3: 8027
    m as if to show that..politica:l:   8: 9241
    of a conversation on politica:l:   2: 5220
reign recognizes his high voca:t:   5: 5489
ast had become her social voca:t:   5: 4763
    him. He will fulfill his voca:t:   2: 5722
rench, and..delivered by a sca:r:   1: 2436
na had had a cough for some da:y:   3: 2226
hed both to rebuke him (for da:r:   4: 8778
Do you know that since your da:u:   3: 8950
    here," said the prince. "My da:u:   2: 3856

SYSTEMS AND METHODS FOR COMPRESSING PACKET DATA BY PREDICTING SUBSEQUENT DATA

CROSS-REFERENCE TO RELATED APPLICATIONS

This application is a continuation-in-part of U.S. patent application Ser. No. 12/313,618, filed Nov. 20, 2008, now U.S. Pat. No. 8,11,431, issued Aug. 19, 2014, and entitled "Systems and Methods for Compressing Packet Data." This application is also related to U.S. patent application Ser. No. 11/240,110, filed Sep. 29, 2005, entitled "Network Memory Appliance for Providing Data Based on Local Accessibility," U.S. patent application Ser. No. 11/998,726, filed Nov. 30, 2007, entitled "Deferred Data Storage," and U.S. patent application Ser. No. 11/825,497, filed Jul. 5, 2007, entitled "Pre-Fetching Data Into a Memory." All of the above applications are incorporated herein by reference.

BACKGROUND

1. Field of the Invention

The present invention is generally related to computer networks. More particularly, the present invention is related to systems and methods for compressing packet data.

2. Related Art

Presently, data compression is useful in many applications. One example is in storing data. As data is compressed to a greater extent, more and more information can be stored on a given storage device. Another example is in transferring data across a communication network. As bandwidth in communication networks is generally viewed as a limited resource, minimizing a size of units of data being sent across the communication network may increase performance of the communication network.

One class of data compression is known as lossless data compression. Lossless data compression allows exact copies of original data to be reconstructed from compressed data. Lossless data compression is used, for example, in the popular ZIP file format and in the Unix tool gzip. Additionally, some image file formats, such as PNG or GIF, use lossless data compression.

A popular technique for lossless data compression is known as LZ77. The basis for LZ77 was developed in 1977 by Abraham Lempel and Jacob Ziv. LZ77 is a substitutional compression algorithm, which operates by effectively identifying repeated patterns in an original version of a data file (or other unit of data) to be compressed, removing the repeated patterns, and inserting pointers to previous occurrences of the repeated patterns in the data file. The pointers may each include a pair of numbers called a 'length-distance pair,' which may sometimes be referred to as a 'length-offset pair.' The length may specify a length of a repeated pattern being removed, whereas the distance or offset may be indicative of a separation between the first occurrence of the repeated pattern and a subsequent occurrence of the repeated pattern being removed. The length and distance may be provided in various manners such as in bytes or characters. The resulting compressed data file may be significantly smaller than the original version of the data file. However, the compressed data file can be decompressed such that the resulting data file is an exact copy of the original version of the data file.

Commonly, data that is transferred across communication networks is divided into packets, also known as datagrams. A packet may be described as a unit of information transmitted as a whole from one device to another via a communication network. In packet switching networks, for example, a packet may be described as a transmission unit of fixed maximum size that consists of binary digits representing both data and a header. The header may contain an identification number, source and destination addresses, and error-control data. To illustrate, a file may be sent by a sending device on one side of a communication network to a receiving device on another side of the communication network. Prior or concurrent to sending, the file may be divided into packets. Subsequently, the packets may be received and reassembled by the receiving device to obtain the file.

One class of compression methods called symbolwise methods, also sometimes referred to as statistical methods, operate by estimating the probabilities of symbols (such as text characters or binary data), coding one symbol at a time, and using shorter codewords for the most likely symbols. Morse code is an example of a symbolwise method. The more accurate the probability estimate, the greater the amount of compression that can be achieved. Taking into account the context in which a symbol occurs may also help the probability estimate accuracy, thereby enhancing compression.

In adaptive compression schemes, the input to the coder is compressed relative to a model that is constructed from the text that has just been coded. LZ methods are one example of adaptive compression techniques. The model serves to predict symbols, which amounts to providing a probability distribution for the next symbol that is to be coded. The model provides this probability distribution to the encoder, which uses it to encode the symbol that actually occurs. Predictions can usually be improved by taking account of the previous symbol. Models that take a few immediately preceding symbols into account to make a prediction are called finite-context models of order m, where m is the number of previous symbols used to make the prediction.

There are many ways to estimate the probabilities in a model. Static models always use the same model regardless of what text is being coded. Semi-static models generate a model specifically for each file that is to be compressed. Adaptive models begin with a general probability distribution and then gradually alter it as more symbols are encountered. The encoder and decoder keep a running tally of the number of instances of each symbol so that they may calculate the same probability distributions.

An adaptive model that operates character by character, with no context used to predict the next symbol, is called a zero-order model. The probability that a particular subsequent character will occur is estimated to be the number of prior instances of that character divided by the total number of prior characters. The model provides this estimated probability distribution to an encoder such as an arithmetic coder. The corresponding decoder is also able to generate the same model since it has decoded all of the same characters up to that point.

For a higher-order model, the probability is estimated by how often that character has occurred in the current context. For example, in a first-order model, the prior character received is used as a context basis. If the character to be encoded is an l, and the prior character received is an a, the first order model would calculate how many times previously an a was followed by an l, to estimate the probability of an l occurring in this context. In a second-order model, the prior two characters received is used as the context basis. The prior characters ca would be evaluated for how often that string of characters was followed by an l. Generally, the higher the order of a model, the more likely that a more accurate probability will be calculated, thus allowing the information to be encoded in fewer bits of data. As long as the encoder and decoder use the same rules for adding context and the context used is based on previously encoded text only, the encoder and decoder will remain synchronized, thus allowing for an exact replica of the original text to be reproduced by the decoder.

Converting the probabilities into a bitstream for transmission is called coding. Symbolwise methods often use Huffman coding or arithmetic coding. An arithmetic coder stores two numbers, a low value and a high value, to represent the range of the probability distribution of the character to be encoded. Thus, a string of characters is replaced with a number between zero and one. The number is assigned based on the probability of the particular character appearing again in the string of characters. A probability of one indicates that the character is certain to occur, whereas a probability of zero indicates that the character is certain to not occur. The arithmetic coding step involves narrowing the interval between the low value and high value to a range corresponding to the probability of the character to be coded appearing again in the string of characters, and then outputting a value or symbol that is within the narrowed range.

The decoder simulates what the encoder must be doing. When it receives the first transmitted value or symbol from the encoder, it can see which range the value falls under and thus see the character that corresponds to that probability range. It then narrows the probability range for the subsequent character, just like the encoder does. Thus, when the second value or symbol is received, the decoder has a similar probability range as the encoder did when encoding the symbol, so it can see which range the value falls under, and thus what the original character was. Decoding proceeds along these lines until the entire character string has been reconstructed.

In natural languages, such as English, research has shown that the probability of the next character to appear in a string is highly dependent on the previous characters. Prediction by partial matching (PPM) is one method of predicting the next character in a string of characters based on the previous characters in the string. It is an adaptive statistical data compression technique that uses a set of previous characters in an uncompressed string of characters to predict the next character in the string. Using PPM with arithmetic coding can improve the compression rate, thus allowing a string of characters to be represented with even fewer bits.

Instead of being restricted to one context length (only first-order models or only second-order models), PPM uses different contexts, depending on what contexts have been observed in the previously coded text. For example, if the word that is to be encoded is political and the politica has previously been encoded, such that the next character is an l. The model may start with a context of the previous five characters to try to make a prediction. Thus, the model would look for instances where itica has previously occurred. If this string of characters is found, then the model would calculate the probability that the next letter after this string is an l, and encode a value associated with that probability. If, however, no match is found in the previously encoded characters for itica (i.e. this combination of characters has not occurred yet), then the model switches to a context of four characters. Thus, the model searches the previously encoded text for tica. Searching continues in this way until a match is found in the prior text.

If the model finds that the prior string tica has occurred before, but it has never been followed by an l, then this is a zero-frequency situation. Since the probability of an l occurring cannot be zero, a special "escape" symbol is sent by the encoder that tells the decoder that the symbol cannot be coded in the current context and that the next smaller context should be tried. Once the escape symbol is transmitted, both the encoder and decoder shift down to the smaller context of three symbols. Thus, one bit of data has been transmitted so far (the escape symbol) and one coding step completed. The model then searches for ica in the prior text. If this string is found, the probability of this string being followed by an l is calculated. In total, two encoding steps were required to encode this letter l. During the early parts of the text, while the model is still learning, it is unlikely that higher-order contexts will be found to be a match. Conversely, once the model is up to speed, it is unlikely that any of the lower-order contexts will be required.

SUMMARY

Embodiments of the present invention overcome or substantially alleviate prior problems associated with compressing packet data. In exemplary embodiments, one or more packets that have data (i.e., packet data) are used to generate a sorted prefix array of data retrieved up to that point in the process for use in calculating predictions of subsequent data. The packet may have been received by a network memory device, after the packet was sent from a first computer and directed to a second computer over a communication network.

The packet data may be compressed based, at least partially, by transmitting the predicted data instead of the literal data. Furthermore, arithmetic encoding may be invoked in exemplary embodiments. In some embodiments, archives of previously transferred packet data may be stored as blocks of packets (i.e., block data). Packet data may comprise data from a plurality of packets according to various embodiments. The packet data may be stored in network memory as network memory pages. These network memory pages may be used to determine a context for priming the encoder and decoder to enhance the accuracy of the predictions of subsequent data.

The compressed packet data may be transferred over a communication network to the second computer. Prior to reaching the second computer, the compressed packet data may be received by a second network memory device. The one or more sorted prefix arrays on which compression was based may then be retrieved by the second network memory device based on the compressed packet data. The compressed packet data may then be decompressed based on the one or more sorted arrays. Finally, the decompressed packet data may be transferred to the second computer.

BRIEF DESCRIPTION OF THE DRAWINGS

Embodiments are illustrated by way of example, and not by limitation in the figures of the accompanying drawings, in which like references indicate similar elements and in which:

FIG. 5 illustrates an exemplary sorted prefix array.

DETAILED DESCRIPTION

Embodiments of the present invention provide systems and methods for compressing packet data included in packets sent across a communication network. According to some embodiments, a contiguous transmission control protocol (TCP) stream comprises the packets. Additionally, the present invention may allow the parallel processing of packet data from multiple packets across many CPUs without interdependence between the CPUs. In exemplary embodiments, the packet data is compressed by replacing the literal data with a rank value corresponding to a prediction of the data, based on information that has been previously transferred across the communication network. The previously transferred information may be locally accessible and verified for consistency at both a source site and a destination site. Since the packet data is compressed based on this information, rather than only on data included in each packet, the degree of compression that can be achieved is greatly increased. Additionally, this information may be stored as blocks in a network memory to further enhance performance. Embodiments of the present invention may be practiced on any device that is configured to transfer packets via a communication network and configured to store or access data that has been previously transferred. While some embodiments of the present invention will be described in reference to operation on a network memory appliance, the present invention may be practiced on any device.

Figure 1:
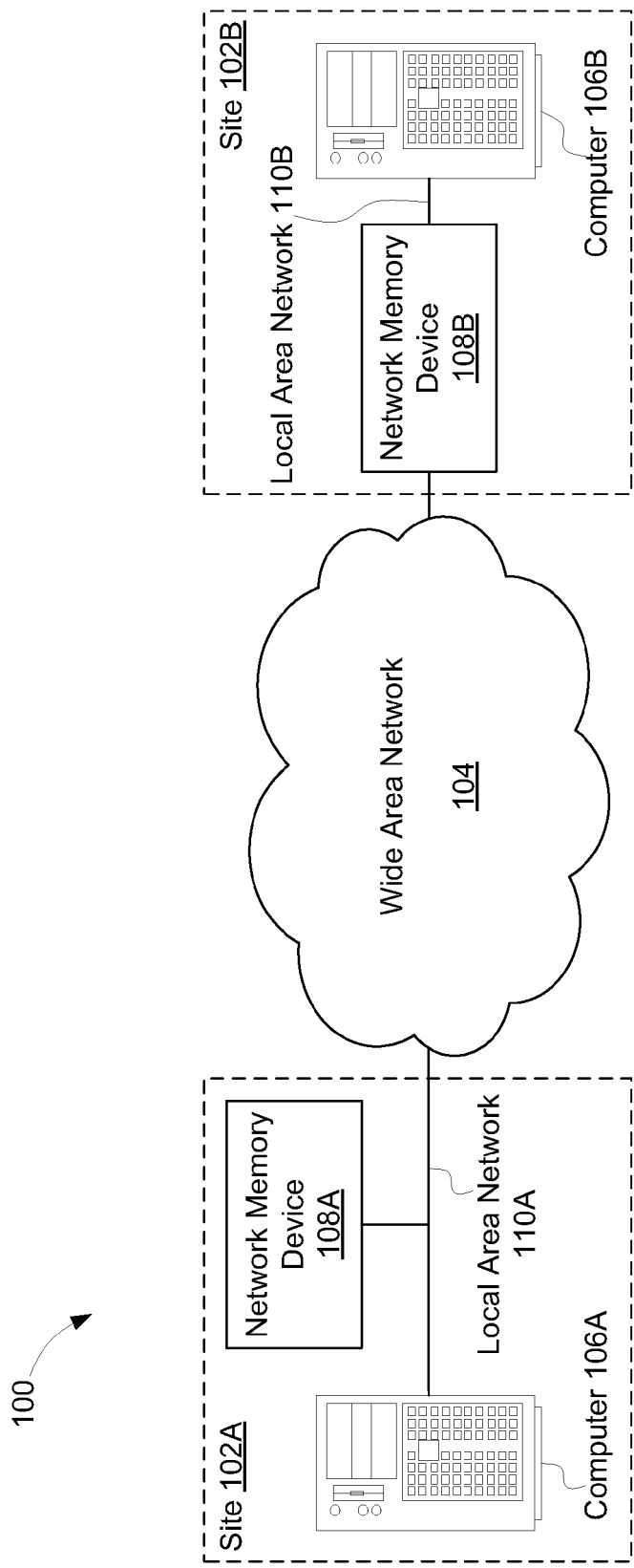
FIG. 1 is a block diagram of an exemplary environment for compressing packet data.

FIG. 1 is a block diagram of an exemplary environment 100 for compressing packet data. As depicted, the environment 100 includes site 102A in communication with site 102B via a wide area network (WAN) 104. Although only two sites, the site 102A and the site 102B, are shown in FIG. 1, the environment 100 may comprise three or more sites and still fall within the scope of embodiments of the present invention. The site 102A includes a computer 106A and a network memory device 108A coupled by a local area network (LAN) 110A. Similarly, the site 102B includes a computer 106B and a network memory device 108B coupled by a local area network 110B. In various embodiments, the sites 102A and 102B may further include a router or switch (not shown). The router or switch may, for example, facilitate communication between the local area network 110A and the wide area network 104, and between the local area network 110E and the wide area network 104. Other networking hardware may also be included in the sites 102A and 102B, as will be appreciated by those skilled in the art.

The sites 102A and 102B may comprise physical locations, such as offices, office complexes, stores, homes, and other locally networked sites. The sites 102A and 102B may transfer data therebetween via the wide area network 104. The data may include data base entries, emails, documents, and any other digitized items. In some embodiments, an application may run at one site and be accessed from another site. In such cases, application data may be transferred between the sites 102A and 102B. As discussed further herein, the data transferred between the sites 102A and 102B may be included in packets.

The wide area network 104 may comprise a private network (e.g., a leased line network) or a public network (e.g., the Internet). The wide area network 104 may include hardware and/or software elements that enable the exchange of information (e.g., voice and data) between the site 102A and the site 102B. Routers or switches may be used to connect the wide area network 104 with the sites 102A and 102B, and local area networks thereof (e.g., the local area networks 110A and 110B).

The computers 106A and 106B may comprise a server, a client, a workstation, other computing devices, or the like. In some embodiments, the computers 106A and 106B may comprise other computing devices such as a personal digital assistant (PDA), a Smartphone, a pocket PC, and other various handheld or mobile devices. In some embodiments, one or both of the computers 106A and 106B may be substituted by a plurality of computers (not shown). In one embodiment, the plurality of computers may be located at one physical locale and be in communication via one or more network memory devices (e.g., the network memory devices 108A and 108B) at the same physical locale. In accordance with some embodiments, one or more computers (e.g., the computers 106A and 106B) may be integrated with one or more network memory devices (e.g., the network memory devices 108A and 108B) as single systems.

According to exemplary embodiments, the network memory devices 108A and 108B, as well as any other network memory devices included in the environment 100, provide a 'network memory' to reduce the amount of information traversing the wide area network 104. In one example, the network memory reduces the amount of information traversing the wide area network 104 by one or more orders of magnitude enabling LAN-like performance of the wide area network 104. This may be achieved by eliminating a need to send data over the wide area network 104 that has been previously sent. Additional information related to various exemplary embodiments of the network memory devices 108A and 108B may be found in U.S. patent application Ser. No. 11/240,110, filed Sep. 29, 2005 and entitled "Network Memory Appliance for Providing Data Based on Local Accessibility," which has been incorporated herein by reference.

To illustrate network memory in accordance with various embodiments, an example involving the environment 100 is considered. As packets flow through the local area network 110A, the network memory device 108A receives the packets and stores a copy of data included in the packets (i.e., packet data) as a local instance within the site 102A. Similarly, the network memory device 108B receives packets flowing through the local area network 110E and stores a copy of data included in those packets (i.e., packet data) as a local instance within the site 102B. Therefore, if a particular packet, or data therefrom, is transferred from the computer 106A to the computer 106B, or vice versa, a copy of data included in that particular packet is stored by the network memory devices 108A and 108B within the sites 102A and 102B, respectively.

Continuing with the above example, the site 102A may act as a source site, while the site 102B may act as a destination site. It will be appreciated, however, that both sites 102A and 102B can act simultaneously as source and destination sites. A given packet may be sent from the computer 106A and be directed to the computer 106B. The given packet may be received by the network memory device 108A, which will determine whether data within the given packet matches data stored as a local instance within the site 102B. If the data within the given packet does match data stored as a local instance at the site 102B, there may be no need to resend the given packet over the wide area network 104. This locally stored data at the network memory devices may be used to build the priming context for the prefix array, as further described herein.

The network memory devices 108A and 108B may comprise one or more of a communications interface, a processor, a memory, or storage. Exemplary embodiments of the network memory devices 108A and 108B are discussed in connection with FIG. 10. In some embodiments, the network memory devices 108A and 108B may be referred to as 'network memory appliances,' or simply 'appliances.'

Furthermore, the network memory device 108A or 108B may be installed in-path (as depicted in FIG. 1 with respect to the network memory device 108A) or out-of-path (as depicted in FIG. 1 with respect to the network memory device 108B) in the local area networks 110A and 110B. The term 'in-path,' which may also be referred to as 'in-line,' describes installation configurations in which a device (e.g., the network memory devices 108A and 108B) is physically attached between two communication lines that make up some portion of the local area network. As such, for in-line installations, the network memory device 108B may be installed between one or more computers 106B and a router or switch (not shown) so that any data that flows through the local area network 110E will necessarily flow through the network memory device.

The term 'out-of-path,' on the other hand, describes installation configurations in which a device (e.g., the network memory devices 108A) taps into the local area network, but is not physically attached between two communication lines. In one embodiment where the network memory device 108A is installed out-of-path, the network memory device 108A is coupled to a router (not shown). A number of router protocols, such as web cache communication protocol (WCCP) and various protocols related to policy based routing (PBR), may allow the router to transparently route network traffic to the network memory device 108A.

The local area networks 110A and 110E may cover a relatively small geographic range, such the sites 102A and 102B, and comprise one or more of a wired network (e.g., Ethernet) or a wireless network (e.g., Wi-Fi). The local area networks 110A and 110E may include hardware and/or software elements that enable the exchange of information (e.g., voice and data) between various computers 106A and 106B, devices (e.g., the network memory devices 108A and 108B), and other networking components, such as routers and switches (not shown).

Figure 2:
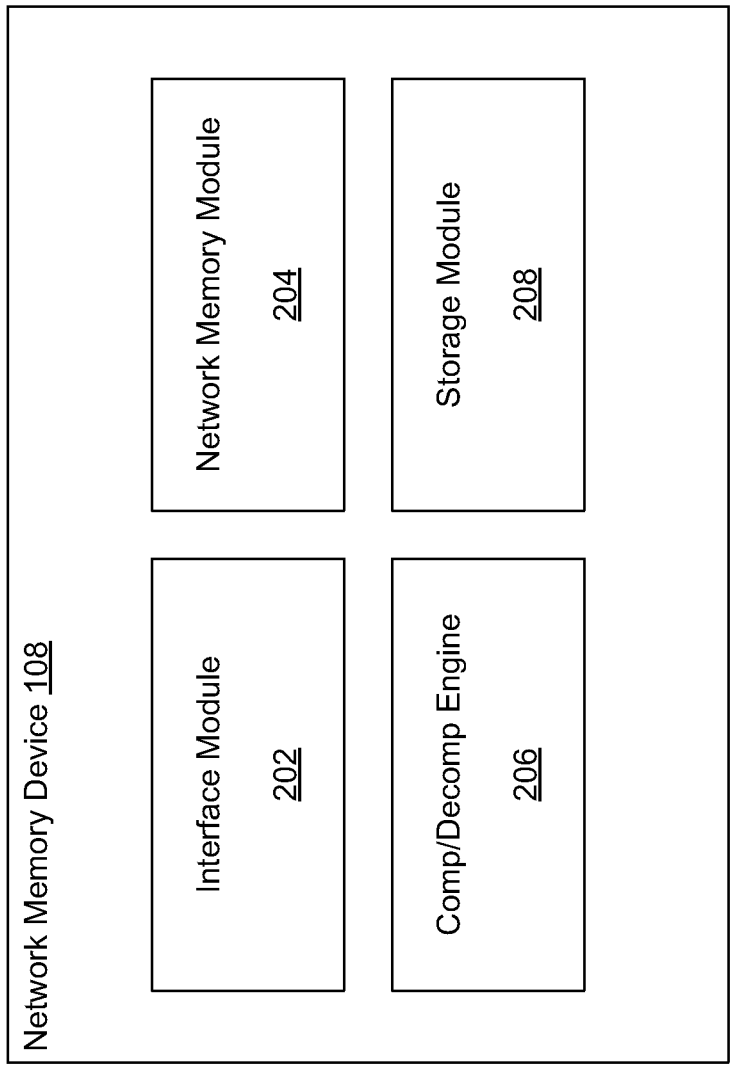
FIG. 2 illustrates an exemplary network memory device.

FIG. 2 illustrates an exemplary network memory device 108. The network memory device 108 may be similar to one or both of the network memory devices 108A and 108B. The network memory device 108 may include an interface module 202, a network memory module 204, a compression/decompression (comp/decomp) engine 206, and a storage module 208. Although FIG. 2 describes the network memory device 108 as including various modules and engines, fewer or more modules and engines may be included in the network memory device 108 and still fall within the scope of various embodiments. Additionally, various modules and engines of the network memory device 108 may be combined into a single module or engine. For example, functionalities of the network memory module 204 and the storage module 208 may be combined into one module.

The interface module 202 may be configured to facilitate communication between the network memory module 204, the compression/decompression engine 206, and the local area network (e.g., the local area network 110A or 110B). For example, information such as packets and packet data may be transferred to and from the network memory device 108 by the interface module 202. The interface module 202 may also receive information such as packets traversing a communication network, as described herein. In exemplary embodiments, the interface module 202 may be further configured to communicate with a global management system (not shown). The global management system may configure, monitor, and manage the network memory device 108 in real-time.

The network memory module 204 may perform various tasks related to the network memory. For example, the network memory module 204 may be configured to store and retrieve copies of the packets, or data therefrom, received by the interface module 202. Furthermore, information stored by the network memory module 204, such as the copies of the packets, or data therefrom, may be synchronized with that of other network memory devices in communication via the wide area network 104. Synchronization of the information may occur continuously, periodically, or after certain prompts, such as the interface module 202 receiving a packet of which a copy has not previously been stored by the network memory module 204. Exemplary methods for synchronizing the information stored by various network memory devices are described in U.S. patent application Ser. No. 11/998,726, filed Nov. 30, 2007 and entitled "Deferred Data Storage," which has been incorporated by reference.

In exemplary embodiments, the copies of the packets may be stored in blocks by the network memory module 204. Generally speaking, a block may be a collection of consecutive bytes of data that are read from or written to a memory device (such as a disk) as a group. In some cases, the block may be further described as a unit of information comprising one or more of identification codes, data, or error-checking codes. In one embodiment, each of the blocks comprises 256 kB. Additionally, the blocks may be referred to as 'pages' or 'network memory pages.'

The network memory module 204 may also be configured to determine 'locally accessible data' of other network memory devices. The locally accessible data of a given network memory device 108 may be described as data that is transferable to a computer by the given network memory device 108 without being transferred over the wide area network 104. Additionally, the locally accessible data may be stored internal to or external to the network memory devices 108. The network memory device 108 may maintain data structures which track which data is locally accessible at each site 102A and 102B. In exemplary embodiments, the network memory device 108 may keep track of which blocks (e.g., 256 kB blocks or pages) are locally accessible at which sites 102A and 102B.

The network memory module 204 may also be configured to generate the priming context for the prefix array, based on locally obtained data. For example, referring to FIG. 1, the interface module 202 of the network memory device 108A may receive a transferred packet sent by the computer 106A directed to the computer 106B over the wide area network 104. The network memory module 204 of the network memory device 108A may determine that the locally accessible data of the network memory device 108B includes data included in the transferred packet. As such, the network memory module 204 of the network memory device 108A may generate an instruction to use the data obtained locally to generate the priming context for the prefix array, and send only the instruction to the network memory device 108B. Using the instruction, the network memory module 204 of the network memory device 108B may locally obtain the data included in the transferred packet, and generate the same priming context. This ensures that computer 106A and computer 106B use the same data to generate the priming context for text compression without the actual packets traversing the wide area network 104 when the data associated with the packets has been previously transferred.

The compression/decompression engine 206 may be configured to compress packet data from packets that are being sent from within the site that includes the network memory device 108 to a remote site across the wide area network 104. The compression/decompression engine 206 may be further configured to decompress the packet data from the packets that is received from the remote site. The compression and decompression of the packet may be based, at least partially, on predictions of subsequent characters and a prefix array, as described further herein.

The storage module 208 may be configured to store various types of information. For example, the storage module 208 may store copies of the packets, or data therefrom, received by the interface module 202 as local instances. The locally accessible data, in turn, may comprise the local instances and be stored by the storage module 208. The locally accessible data may be stored as a prefix array. The locally accessible data may also be stored as blocks in exemplary embodiments. Additionally, the storage module 208 may be synchronized with storage modules of other network memory devices, as discussed herein.

In one example, again referring to FIG. 1, the interface module 202 of the network memory device 108A may receive a transferred packet sent by the computer 106A directed to the computer 106B over the wide area network 104. The compression/decompression engine 206 of the network memory device 108A may compress the packet data from the received packet. The compressed packet data may then be transferred over the wide area network 104 to the network memory device 108B. Accordingly, the compression/decompression engine 206 of the network memory device 108B may decompress the compressed packet data to obtain the packet data from the transferred packet as originally send by the computer 106A. An exemplary embodiment of the compression/decompression engine 206 is discussed in connection with FIG. 3. Additionally, exemplary methods for compressing and decompressing packets are described in connection with FIG. 5 and FIG. 6, respectively.

Figure 3:
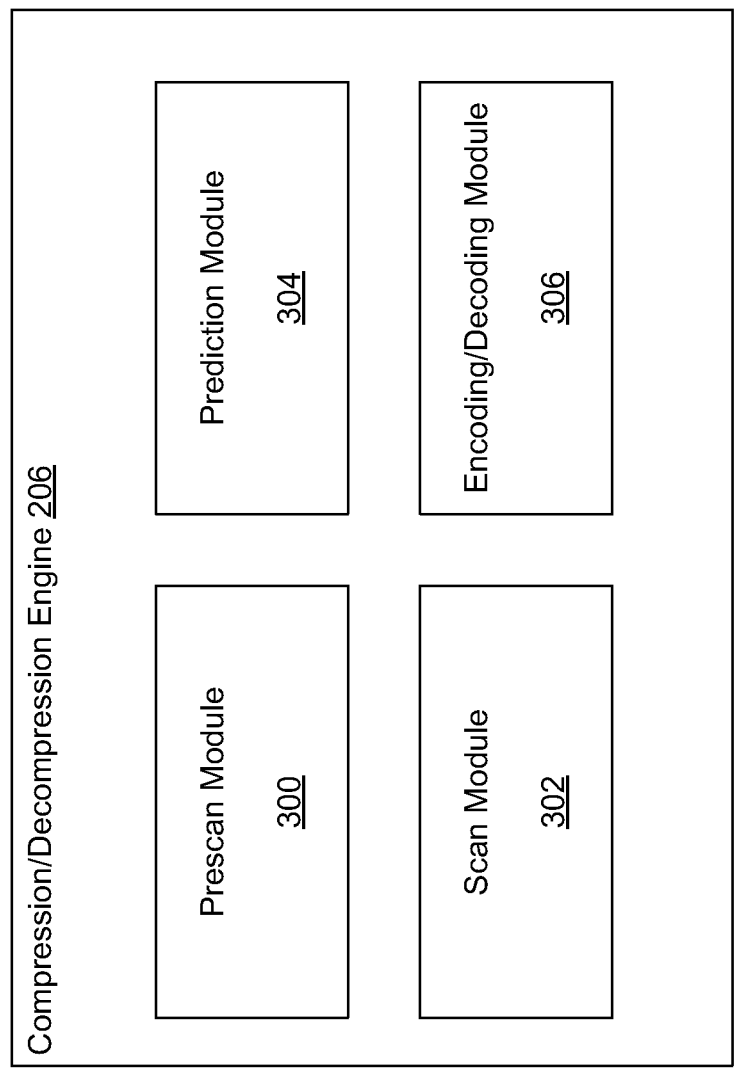
FIG. 3 illustrates an exemplary compression/decompression engine.

FIG. 3 illustrates the compression/decompression engine 206 in accordance with exemplary embodiments. The compression/decompression engine 206 may include a prescan module 300, scan module 302, a prediction module 304, and an encoding/decoding module 306. Although FIG. 3 describes the compression/decompression engine 206 as including various modules, fewer or more modules may be included in the compression/decompression engine 206 and still fall within the scope of various embodiments. Additionally, various modules of the compression/decompression engine 206 may be combined into a single module. For example, functionalities of the prescan module 300, scan module 302, the prediction module 304, and the encoding/decoding module 306 may be combined into one module. Furthermore, one or more of the modules may operate in parallel with the other modules.

The prescan module 300 may be configured to scan packet data part-by-part and compare it to locally accessible data to find locally accessible data that is similar. This locally accessible data may then be used to generate the priming context for the generation of the prefix array for the text compression. Furthermore, the prescan module 300 may also maintain hash tables that may be used to correlate packet data and block data. Pre-scans are described in greater detail below and in U.S. nonprovisional patent application Ser. No. 11/825,497 filed Jul. 5, 2007 and entitled, "Pre-Fetching Data Into a Memory" which is incorporated herein by reference.

The scan module 302 is configured to scan the packet data to generate one or more prefix arrays, for use in predicting subsequent characters. In exemplary embodiments, the scan module 302 may generate one or more prefix arrays associated with the packet data to be compressed. When a first character is received, the scan module may insert it into the prefix array. For every subsequent character received thereafter, the scan module inserts the subsequent character received along with its prefix into the prefix array, sorted by the received subsequent character. The prefix may consist of all prior characters received up to that point in the packet data, block data, memory page, or any other designation. In such a way, a prefix array such as the one shown in FIG. 5 may be generated. In exemplary embodiments, the one or more prefix arrays associated with the packet, the packet data, and/or the block data may be stored in the network memory, a cache, or other storage.

In some embodiments, block data, such as those stored by the network memory module 204, are also scanned by the scan module 302. The block data may be scanned prior to, concurrently with, or subsequent to the scanning of the packet data.

The prediction module 304 is configured use the one or more prefix arrays to generate predictions of the next subsequent characters. In some embodiments, the prediction module 304 may operate in parallel with the scan module 302. The prediction module may be used to calculate the probability that a particular character is to occur next. The probability calculations may be based at least in part on the frequency of occurrence of that particular character, of the length of the prefix that matches the entry of the prefix array, based on other characteristics of the neighborhood of the prefix array, as described herein in connection with FIG. 4, or other methods.

The encoding/decoding module 306 is configured to encode the packet data. The encoding/decoding module 306 may encode the probability distribution calculated by the prediction module 304 of the particular subsequent characters. The encoding/decoding module 306 may encode packet data each character at a time. Furthermore, in instances where the prediction module 304 is unable to predict the probability of a subsequent character occurring, the encoding/decoding module 306 may output an escape value and the actual character itself. Thus, according to exemplary embodiments, encoded packet data generated by the encoding/decoding module 306 may comprise encoded characters. In some embodiments, the encoded packet data may further comprise literal information and an escape value. Literal information may comprise characters from packet data that were not successfully predicted by the prediction module 304.

In addition to encoding the packet data, the encoding/decoding module 306 may be configured to decode encoded packet data. Generally, decoding encoded packet data is achieved by a reciprocal process relative to the process used to encode the packet data.

Figure 4:
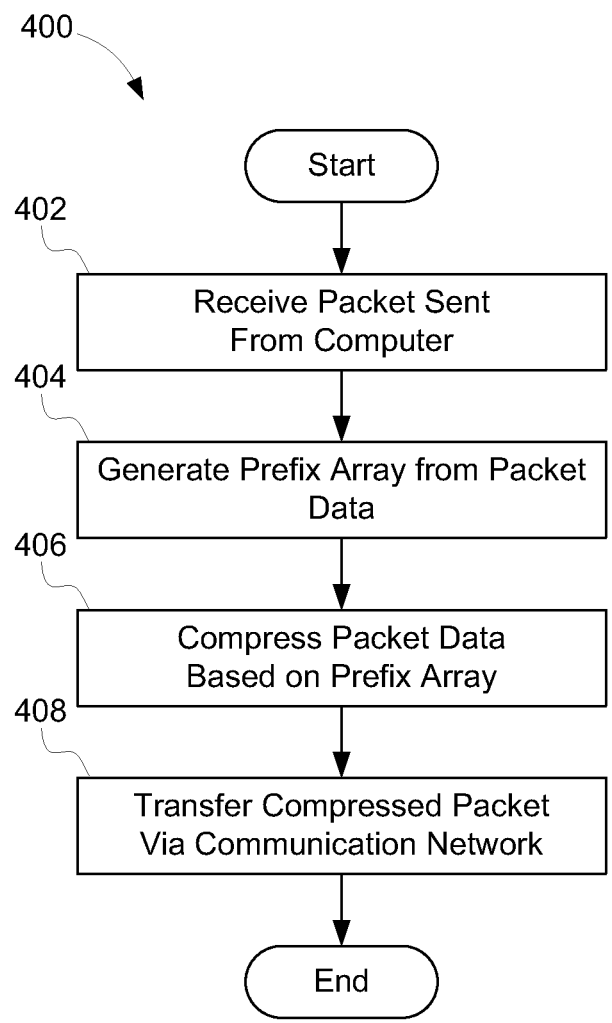
FIG. 4 is a flowchart showing an exemplary method for compressing packet data.

Now referring to FIG. 4, a flowchart showing a method 400 for compressing packet data according to exemplary embodiments is presented. The method 400 may be performed by the network memory device 108 or by modules therein, as described below. Additionally, steps of the method 400 may be performed in varying orders or concurrently. Furthermore, various steps may be added, subtracted, or combined in the method 400 and still fall within the scope of the present invention.

In step 402, a packet is received after being sent from a computer. The packet may be received while flowing through a local area network. For example, the interface module 202 of the network memory device 108A may receive a packet sent from the computer 106A that is directed to the computer 106B. In exemplary embodiments, packets are received transparently. Since the packets are received transparently, the computers sending and receiving the packets (e.g., the computers 106A and 106B) will be unaware of the presence of the network memory device 108A and the retrieval of the packet. Put in other words, the computers 106A and 106B may send packets therebetween in exactly the same manner whether or not network memory devices (e.g., the network memory devices 108A and 108B) are present in the sites 102A and 102B. As such, no additional configuring is required of the computers 106A and 106B, or other hardware or software included in the sites 102A and 102B, in accordance with exemplary embodiments.

In step 404, one or more prefix arrays are generated from the packet data. In exemplary embodiments, the prefix array comprises archives of previously transferred packet data. For example, the prefix array may comprise packet data previously received by the network memory device 108 as described in step 402. Additionally, the one or more blocks may be a part of the network memory. As described above, the network memory module 204 may store or locally access the one or more blocks in network memory. The compression/decompression engine 206 in conjunction with the network memory module 204 may identify the data in network memory similar to the packet data included in the packet. In exemplary embodiments, the one or more prefix arrays may be generated for a packet, a block, a network memory page, or any other combination thereof.

In step 406, the packet data is compressed based on the prefix array, as further described in connection with FIGS. 5 and 6. A lossless compression scheme or algorithm may be invoked such that the packet data originally included in the packet can be reconstructed. Generally speaking, lossless compression algorithms may exploit statistical redundancy in such a way as to represent the packet data more concisely without error. A compressed packet may comprise the compressed version of the packet data originally included in the packet as well as information to identify the data on which the compression of the packet data was, at least partially, based.

In step 408, the compressed data is transferred via a communication network. In exemplary embodiments, the interface module 202 may transfer the compressed packet via the communication network. The communication network may comprise one or more of a local area network (e.g., local area networks 110A and 110B) and a wide area network (e.g., the wide area network 104). In one example, packet data from a packet that was originally sent by the computer 106A and directed to the computer 106B, which in turn was subsequently received, compressed by the network memory device 108A, and included in a compressed packet, may be transferred to the site 102B via the wide area network 104. Accordingly, the compressed packet may be received by the site 102B.

FIG. 5 depicts an exemplary prefix array 500. The prefix array is a sorted list of all characters that have been retrieved up to that point, along with their prefix. The prefix may comprise all prior characters retrieved by the module up to that point. The prefix array is also sorted from right to left. In the exemplary prefix array 500, the array has 4 columns. Column 504 comprises the retrieved character, which is also the character that is to be predicted by the prediction module 304.

Column 502 comprises the prefix of the retrieved character, which is all of the characters that occur prior to the retrieved character, from the beginning of the text document to be compressed, the network memory page, packet, designated sync point, or any other designation. The prefixes of the entries in the prefix array may be sorted from right to left.

Column 506 denotes the common prefix length, i.e., how many characters or bytes of the prefix of that particular entry match with the entry below it. For example, in exemplary prefix array entry 510, there are eight matching bytes between that line and the line below it (a, c, i, t, i, l, o, p). The next byte is where the prefixes are different, for in entry 510 the next byte is a period, whereas in the entry below it, the next byte is a space. Thus, in this way, the number of matching bytes in the prefix is calculated. Column 508 of the prefix array denotes how many characters have been retrieved thus far from the module.

Figure 6:
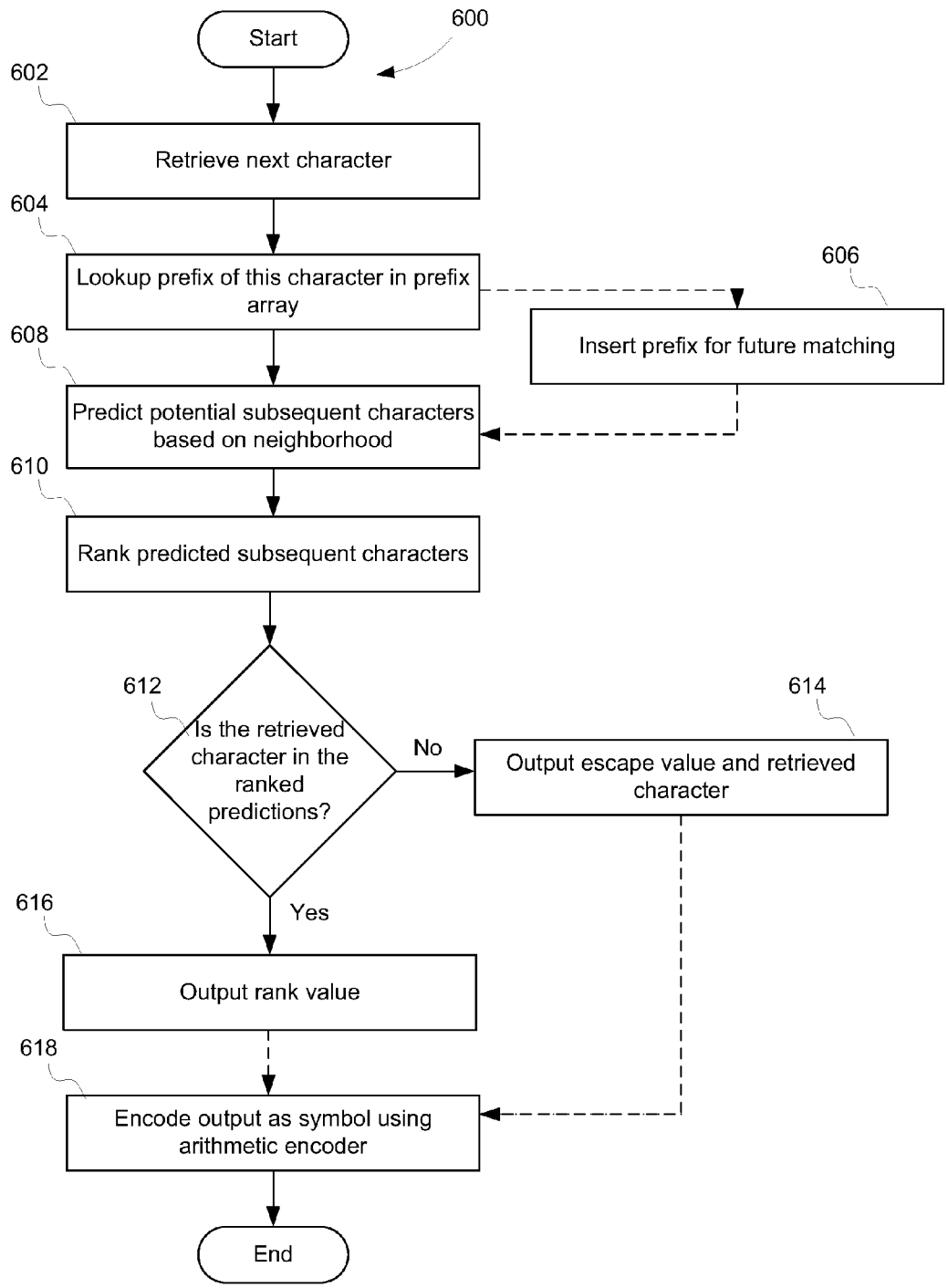
FIG. 6 is a flowchart showing a method for compressing packet data in accordance with exemplary embodiments.

FIG. 6 describes an exemplary method 600 for compressing packet data by predicting subsequent characters. The method 600 may be performed by the network memory device 108 or by modules therein, as described below. Additionally, steps of the method 600 may be performed in varying orders or concurrently. Furthermore, various steps may be added, subtracted, or combined in the method 600 and still fall within the scope of the present invention.

In step 602, a next character is retrieved. The next character may comprise text of any language, symbols, or binary data (e.g. 1 byte of data). A next character can be any character after a first character is inserted into a prefix array. When the module retrieves the next character to be predicted, it looks up the prefix of this character in the one or more prefix arrays in step 604. In some embodiments, the prefix array is an array of data that comprises each subsequent character that has been retrieved, and the prefix of that character. The prefix of that character may comprise all characters retrieved prior to that point in the process. The prefix may be determined by the prior characters retrieved in the packet data, the block data, or from a particular network memory page. In other embodiments, the prefix may be determined by the prior characters retrieved from a particular volume of text, such as a book, chapter, or page.

Once the prefix of the retrieved character is identified in the prefix array, the module looks to other entries in the neighborhood of the prefix array. The neighborhood may be other entries in the prefix array that are in the vicinity of the identified entry. Additionally, the neighborhood may comprise other entries in the prefix array that have at least a certain number of matching characters in the prefix. The number of matching characters in the prefix that are needed to define the neighborhood may be varied. In exemplary embodiments, the neighborhood may be a static determination, such as 10 entries above and 10 entries below the prefix array entry that has the matching prefix. In other embodiments, the neighborhood may be a dynamic determination that can be varied based on any number of factors, including number of total entries in the prefix array, number of matching characters in the prefix, or any other metric.

Once the neighborhood has been identified, the module looks to the entry in the prefix array with the matching prefix and scans the various subsequent characters of these prefixes in the neighborhood from column 504 in the prefix array. For example, if the neighborhood is taken to be 5 entries above and below entry 510 in the prefix array of FIG. 5, then the various retrieved characters from column 504 consist of n, l, space, m, t, l, t, t, t, r. Based on this neighborhood, there is one occurrence each of an n, space, m, and r. There are two occurrences of an l, and four occurrences of a t. These may comprise the potential subsequent characters based on the neighborhood in step 608. From this data, these predicted subsequent characters may then be ranked in step 610 and a rank value is calculated that represents the probability of the retrieved character being one of the predicted subsequent characters.

Optionally, once the closest match of the prefix of the retrieved character is identified in the prefix array in step 604, the retrieved character and its prefix may be added as an entry to the prefix array for future matching in step 606. This may improve the context for future matching. In some embodiments, while the scan module is near the beginning of scanning the data from which the prefix array is to be generated, most, if not all, of the retrieved characters and prefixes may be inserted into the prefix array to generate the context for predicting the subsequent characters. Later, while the scan module is near the end of the data from which the prefix array is to be generated, the module may choose to not insert every instance of every retrieved character and its prefix into the prefix array.

If the retrieved character from step 602 is in the ranked predictions in step 612, for example, if the retrieved character is an n, m, space, r, l, or t, then the calculated rank value is outputted in step 616 by the module. Optionally this value may then be encoded as a symbol using an arithmetic encoder in step 618. If the retrieved character from step 602 is not one of the ranked predicted characters in step 612, then the module outputs an escape value and the retrieved character itself in step 614. An escape value may comprise a "0", or be any other character or symbol that denotes to the module that the character was not predicted by the prefix array, and so the character itself is output by the module. The escape value and retrieved character may also be optionally encoded as a symbol using an arithmetic encoder in step 618.

Figure 7:
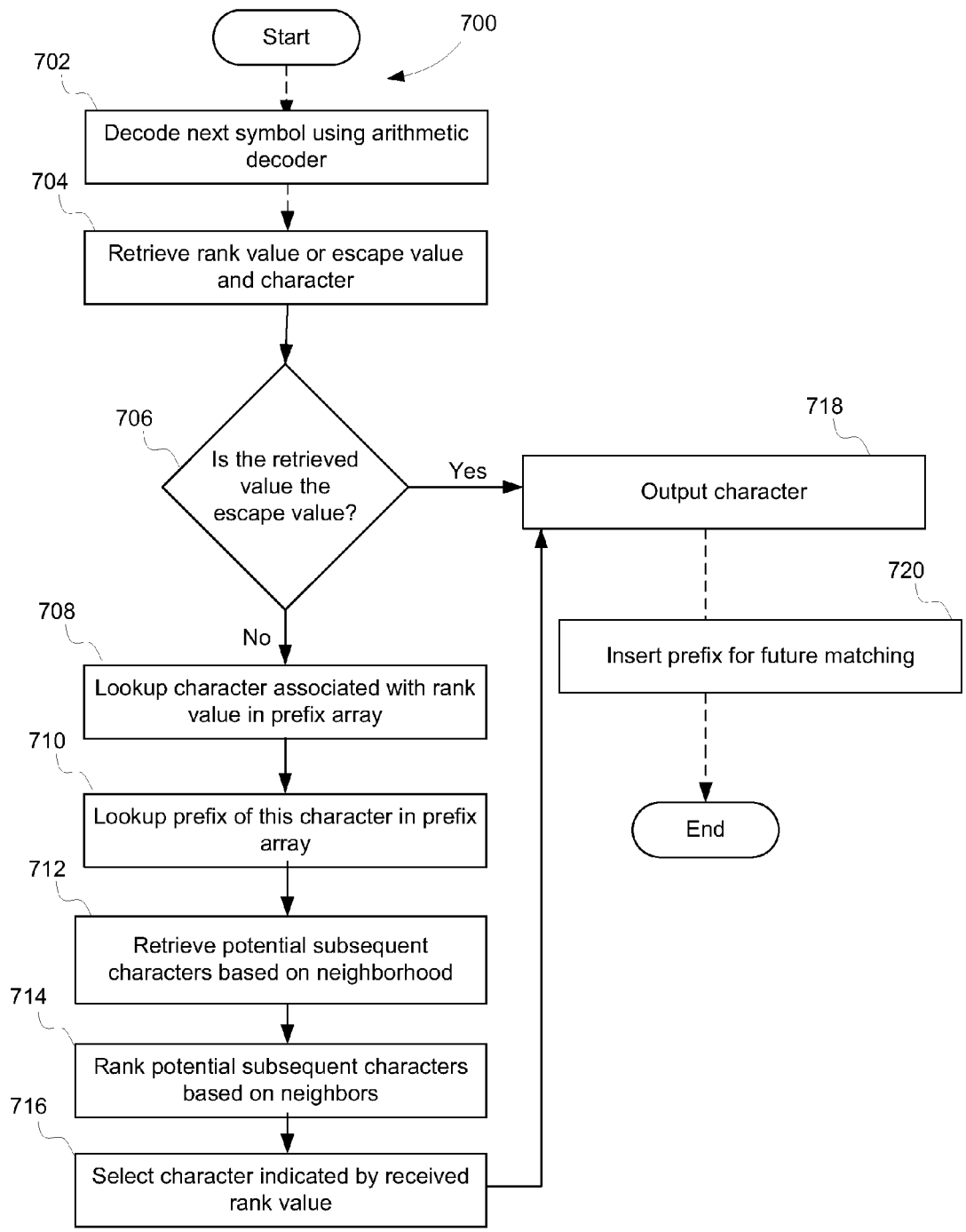
FIG. 7 is a flowchart showing a method for decompressing packet data in accordance with exemplary embodiments.

Now referring to FIG. 7, a flowchart showing an exemplary method 700 for decompressing packet data using predicted subsequent characters is presented. The method 700 may be performed by the network memory device 108 or by modules therein, as described below. Additionally, steps of the method 700 may be performed in varying orders or concurrently. Furthermore, various steps may be added, subtracted, or combined in the method 700 and still fall within the scope of the present invention.

In embodiments where an arithmetic encoder is used to encode the output, the method begins at step 702 with an arithmetic decoder. The arithmetic decoder decodes the next symbol retrieved, and then moves to step 704. In embodiments where an arithmetic encoder is not used and the compression method ends at step 616, the decompressing method begins at step 704 with the retrieval of the rank value or the escape value and retrieved character that is output from the compression process. If the retrieved value is the escape value, then the decompression engine 206 outputs the retrieved character in step 718.

If the retrieved value is not the escape value, then it must be the rank value in step 706. As characters are received by the decompression engine 206, it also builds the same prefix array as the compression engine. The decompression engine 206 uses the same neighborhood and ranking and encoding algorithms as the compression engine. Thus, the decompression engine 206 is also able to calculate the same probabilities as the compression engine. Once the character associated with the retrieved rank value is located in the prefix array 708, the engine looks up the prefix of this character in the prefix array entry in step 710. From there, the engine looks to the neighborhood of the matching prefix array entry to retrieve the potential subsequent characters in step 712. The neighborhood may be a dynamic variable such that the range of entries to be evaluated can be varied. The potential subsequent characters are then ranked based on the neighborhood in step 714.

Once the decompression engine 206 has the various rank values that are associated with each subsequent character, it can then select the character indicated by the retrieved rank value in step 716. The subsequent character is then output by the engine in step 718. Optionally, the decompression engine may insert the prefix and subsequent character as a new entry in the prefix array to improve the context for future matching, in step 720.

Figure 8:
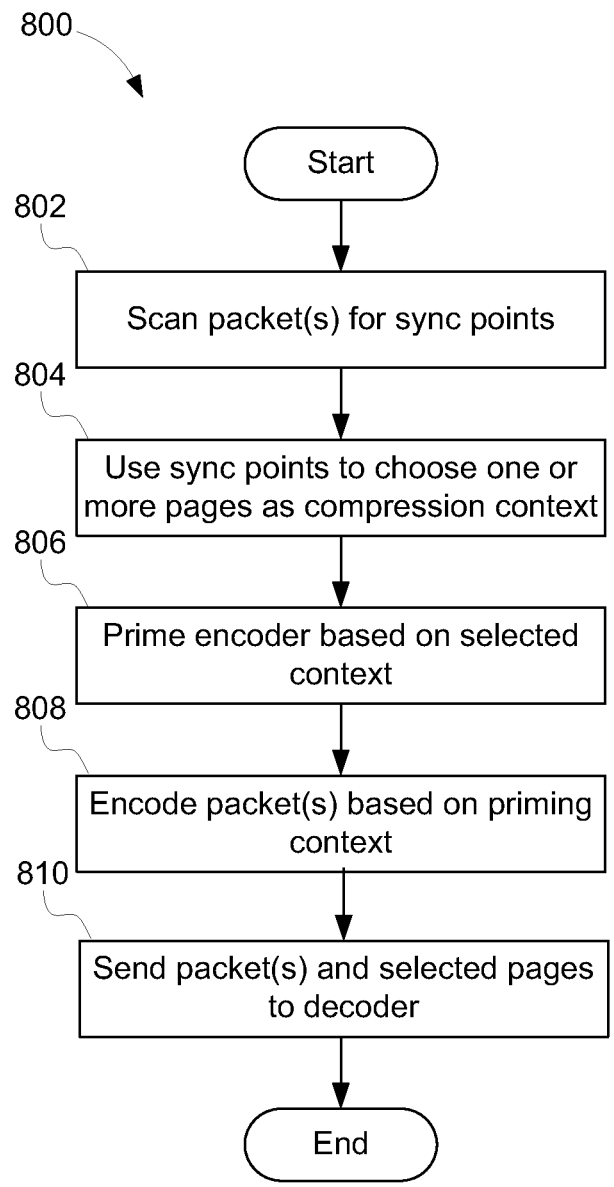
FIG. 8 is a flowchart showing an exemplary method for encoding packet data.

Now referring to FIG. 8, a flowchart showing a method 800 for encoding packet data according to exemplary embodiments is presented. The method 800 may be performed by the network memory device 108 or by modules therein. Additionally, steps of the method 800 may be performed in varying orders or concurrently. Furthermore, various steps may be added, subtracted, or combined in the method 800 and still fall within the scope of the present invention.

In step 802, a packet is received after being sent from a computer and is scanned for sync points. A sync point may be a coarse sync point or fine sync point, as described in U.S. patent application Ser. No. 11/998,726, filed Nov. 30, 2007 and entitled "Deferred Data Storage," which has been incorporated by reference. The more sync points there are, the easier it is to identify repeated data, but the larger the hash tables need to be in order to index a given amount of information for the data flow. Having a coarse and fine table helps optimize this tradeoff. In alternate embodiments, a single table or multiple tables may be used.

Once the sync points are identified in step 802, they are then used in step 804 to choose one or more network memory pages as a compression context. The sync points help define the location of data in the network memory pages that would be best used for setting up the compression context, since they help identify repetitive data. Once the context is selected, the data from the selected network memory pages may be used in step 806 to prime the encoder. The priming operation may comprise generating the prefix array using all of the information in the selected network memory pages, or a subset of the information. This eliminates the need for a "warming up" period. If the prefix array is already primed with information from data that is likely to be repetitive to received data, then the prefix array will be able to provide more successful predictions of subsequent characters, and hence better compression of the data.

The encoding module then encodes the received packet based on the priming context in step 808, and sends the encoded packet along with the selected network memory pages to the decoder 810. The decoder uses the same context as the encoder to generate the same primed prefix array as the encoder.

Figure 9:
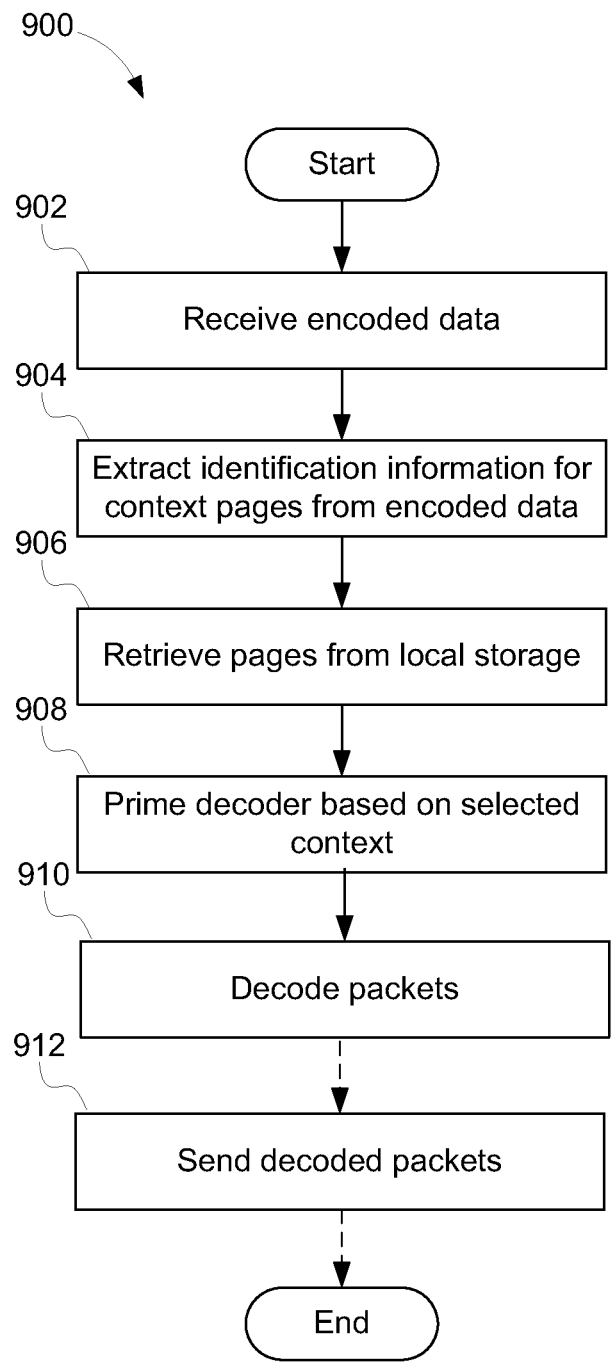
FIG. 9 is a flowchart showing an exemplary method for decoding packet data.

FIG. 9 is a flowchart showing an exemplary method 900 for decoding packet data. The method 900 may be performed by the network memory device 108 or by modules therein. Additionally, steps of the method 900 may be performed in varying orders or concurrently. Furthermore, various steps may be added, subtracted, or combined in the method 900 and still fall within the scope of the present invention.

In step 902, the decoder receives the encoded data from the encoder. The encoded data may comprise the encoded packet and encoded identification information for the selected network memory pages. In step 904, the identification information for the selected network memory pages, which may comprise information regarding where the selected network memory pages are located in memory, is extracted from the encoded data. The network memory pages are then retrieved from local storage in step 906, to generate the context for the compression algorithm. These retrieved network memory pages may then be used to prime the decoder in step 908 based on the selected context. The priming operation at the decoder is substantially similar to the priming operation at the encoder such that the decoder may generate the same literal data that was encoded. In step 910, the packets are decoded, and in step 912 the decoded packet data is transferred on to the receiving computer.

Figure 10:
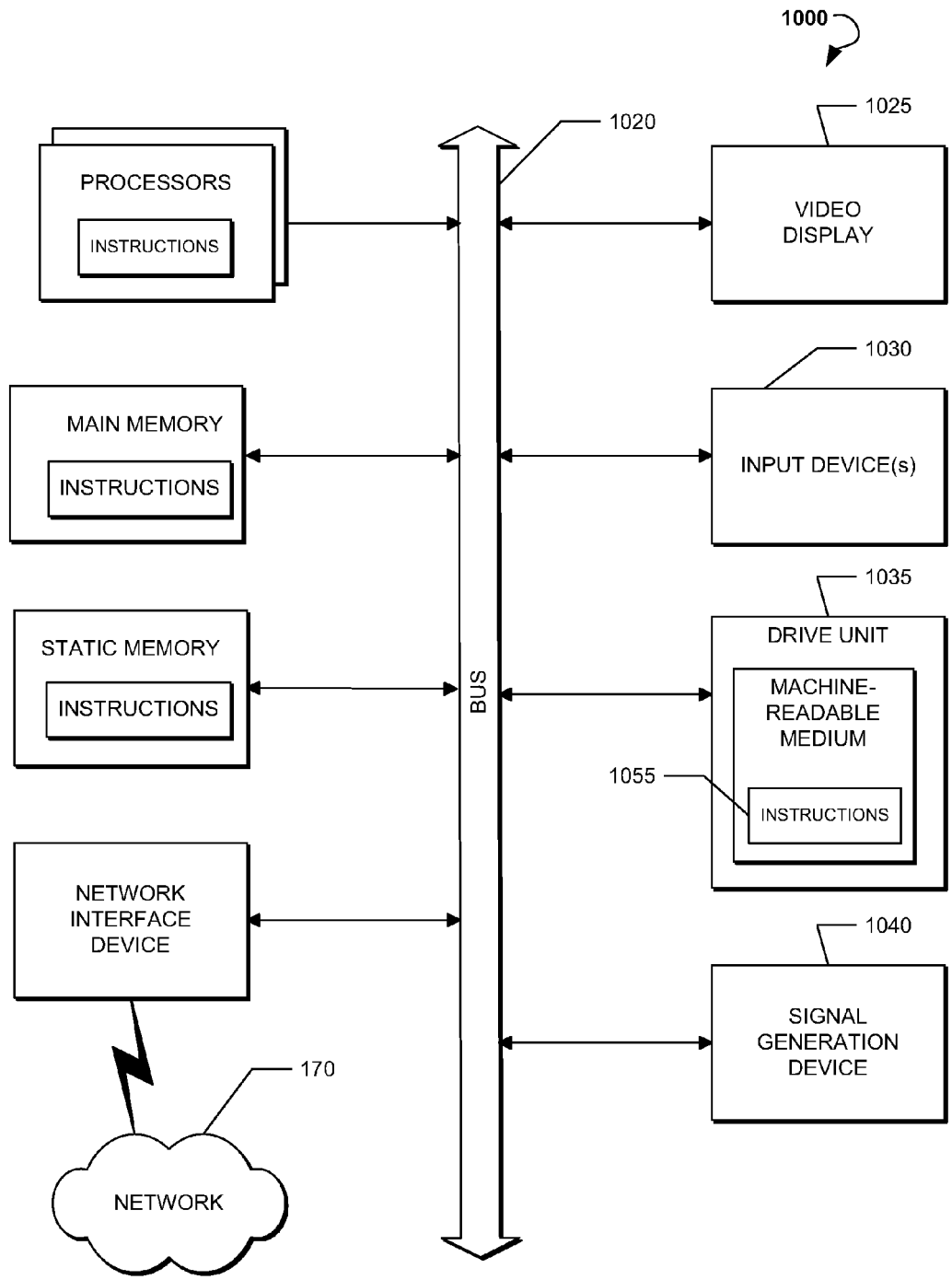
FIG. 10 illustrates an exemplary network device.

FIG. 10 shows a diagrammatic representation of a computing device for a machine in the example electronic form of a computer system 1000, within which a set of instructions for causing the machine to perform any one or more of the methodologies discussed herein can be executed. In example embodiments, the machine operates as a standalone device, or can be connected (e.g., networked) to other machines. In a networked deployment, the machine can operate in the capacity of a host, a client machine in a host-client network environment, or as a peer machine in a peer-to-peer (or distributed) network environment. The machine can be a PC, tablet PC, set-top box (STB), PDA, cellular telephone, portable music player (e.g., a portable hard drive audio device, such as a Moving Picture Experts Group Audio Layer 3 (MP3) player), web appliance, network router, switch, bridge, or any machine capable of executing a set of instructions (sequential or otherwise) that specify actions to be taken by that machine. Further, while only a single machine is illustrated, the term "machine" shall also be taken to include any collection of machines that separately or jointly execute a set (or multiple sets) of instructions to perform any one or more of the methodologies discussed herein.

The example computer system 1000 includes a processor or multiple processors 1005 (e.g., a central processing unit (CPU), a graphics processing unit (GPU) or both), and a main memory 1010 and a static memory 1015, which communicate with each other via a bus 1020. The computer system 1000 can further include a video display unit 1025 (e.g., a LCD or a cathode ray tube (CRT)). The computer system 1000 also includes at least one input device 1030, such as an alphanumeric input device (e.g., a keyboard), a cursor control device (e.g., a mouse), a microphone, a digital camera, a video camera, and so forth. The computer system 1000 also includes a disk drive unit 1035, a signal generation device 1040 (e.g., a speaker), and a network interface device 1045.

The disk drive unit 1035 includes a computer-readable medium 1050, which stores one or more sets of instructions and data structures (e.g., instructions 1055) embodying or utilized by any one or more of the methodologies or functions described herein. The instructions 1055 can also reside, completely or at least partially, within the main memory 1010 and/or within the processors 1005 during execution thereof by the computer system 1000. The main memory 1010 and the processors 1005 also constitute machine-readable media.

The instructions 1055 can further be transmitted or received over the communications network 170 via the network interface device 1045 utilizing any one of a number of well-known transfer protocols (e.g., Hyper Text Transfer Protocol (HTTP), CAN, Serial, and Modbus).

While the computer-readable medium 1050 is shown in an example embodiment to be a single medium, the term "computer-readable medium" should be taken to include a single medium or multiple media (e.g., a centralized or distributed database, and/or associated caches and hosts) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media. Such media can also include, without limitation, hard disks, floppy disks, flash memory cards, digital video disks (DVDs), random access memory (RAM), read only memory (ROM), and the like.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software programs for implementing the present method can be written in any number of suitable programming languages such as, for example, Hypertext Markup Language (HTML), Dynamic HTML, XML, Extensible Stylesheet Language (XSL), Document Style Semantics and Specification Language (DSSSL), Cascading Style Sheets (CSS), Synchronized Multimedia Integration Language (SMIL), Wireless Markup Language (WML), Java™, Jini™, C, C++, C#, .NET, Adobe Flash, Perl, UNIX Shell, Visual Basic or Visual Basic Script, Virtual Reality Markup Language (VRML), ColdFusion™ or other compilers, assemblers, interpreters, or other computer languages or platforms.

Thus, methods and systems for compressing packet data by predicting the data are disclosed. Although embodiments have been described with reference to specific example embodiments, it will be evident that various modifications and changes can be made to these example embodiments without departing from the broader spirit and scope of the present application. Therefore, these and other variations upon the exemplary embodiments are intended to be covered by the present invention. Accordingly, the specification and drawings are to be regarded in an illustrative rather than a restrictive sense.

What is claimed is:

1. A method for compressing data using predicted subsequent characters, comprising:
   retrieving a character;
   locating a position for a prefix of the retrieved character in a prefix array, the prefix array comprising characters received to that point in a process;
   generating at least one prediction of a subsequent character based on a neighborhood of retrieved characters of the prefix of the received character in the prefix array;
   ranking the at least one predicted subsequent characters;
   determining if the retrieved character is one of the at least one predicted subsequent characters; and
   outputting a rank value if the subsequent character is one of the at least one predicted subsequent characters, and transmitting an escape value and the retrieved character if the retrieved character is not one of the at least one predicted subsequent characters.

2. The method of claim 1, further comprising encoding the escape value and the retrieved character, or the rank value, using an arithmetic encoder.

3. The method of claim 1, wherein an arithmetic encoder uses neighborhood characters as a context.

4. The method of claim 1, further comprising inserting the prefix of the retrieved character into the prefix array along with the retrieved character.

5. The method of claim 1, wherein the rank value is based at least in part on the frequency of occurrence of the predicted subsequent character in the neighborhood of the prefix array.

6. The method of claim 1, wherein the rank value is based at least in part on the length of prefix of the retrieved character in the prefix array.

7. The method of claim 1, further comprising priming the prefix array with prefixes from one or more network memory pages.

8. The method of claim 7, wherein the one or more network memory pages are selected by a scan module.

9. The method of claim 1, further comprising:
receiving the rank value or the escape value and the retrieved character;
locating the predicted subsequent character based on the rank value in the prefix array; and
outputting the predicted subsequent character based on the rank value, or outputting the retrieved character if the escape value is received.

10. A non-transitory machine readable medium having embodied thereon a program, the program providing instructions for a method for compressing packets, the method comprising:
retrieving a character;
locating a position for a prefix of the retrieved character in a prefix array, the prefix array comprising characters received to that point in a process;
generating at least one prediction of a subsequent character based on a neighborhood of retrieved characters of the prefix of the received character in the prefix array;
ranking the at least one predicted subsequent characters;
determining if the retrieved character is one of the at least one predicted subsequent characters; and
outputting a rank value if the subsequent character is one of the at least one predicted subsequent characters, and transmitting an escape value and the retrieved character if the retrieved character is not one of the at least one predicted subsequent characters.

* * * * *